(12) United States Patent
Hung et al.

(10) Patent No.: US 8,173,548 B2
(45) Date of Patent: May 8, 2012

(54) REVERSE PLANARIZATION METHOD

(75) Inventors: Chi-Cheng Hung, Toufen Township, Miaoli County (TW); Yung-Sung Yen, Taipei County (TW); Chun-Kuang Chen, Hsin-Chu Hsien (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 161 days.

(21) Appl. No.: 12/789,709

(22) Filed: May 28, 2010

(65) Prior Publication Data

US 2011/0294286 A1 Dec. 1, 2011

(51) Int. Cl.
*H01L 21/311* (2006.01)

(52) U.S. Cl. .. 438/697; 438/626; 438/699; 257/E21.206

(58) Field of Classification Search .......... 438/631–633, 438/626, 690–692, 697, 699; 257/E21.206, 257/E21.576, E21.583
See application file for complete search history.

(56) References Cited

U.S. PATENT DOCUMENTS

| | | | |
|---|---|---|---|
| 2008/0191249 A1* | 8/2008 | Hsieh et al. | 257/290 |
| 2009/0253080 A1 | 10/2009 | Dammel et al. | |
| 2009/0253081 A1 | 10/2009 | Abdallah et al. | |
| 2009/0258318 A1 | 10/2009 | Chan | |
| 2009/0258501 A1 | 10/2009 | Chan | |

OTHER PUBLICATIONS

Masanori Yamaguchi et al., "A Study of Photoresist Pattern Freezing for Double Imaging Using 172nm VUV Flood Exposure", 25th International Conference of Photopolymer Science and Technology (ICPST-25), pp. 35-41.
Mark Slezak, "Double Patterning Single Etch Solutions from JSR", The Nikon eReview, Fall 2008, 3 pages.
Douglas J. Guerrero et al., "Resist Double Patterning on BARCs and Spin-On Multilayer Materials", 8 pages.

* cited by examiner

*Primary Examiner* — Thanhha Pham
(74) *Attorney, Agent, or Firm* — Haynes and Boone, LLP (57) ABSTRACT

A method for fabricating an integrated circuit device is disclosed. The method includes providing a substrate; forming a semiconductor feature over the substrate; forming a first photoresist layer over the substrate; performing a lithography process on the first photoresist layer, such the first photoresist layer includes an opening therein that exposes the semiconductor feature; performing a stabilization process on the first photoresist layer; forming a second photoresist layer over the first photoresist layer, wherein the second photoresist layer fills the opening; and etching back the first and second photoresist layers until the semiconductor feature is exposed.

20 Claims, 7 Drawing Sheets

REVERSE PLANARIZATION METHOD

TECHNICAL FIELD

The present disclosure relates generally to methods for manufacturing integrated circuit devices, and more particularly, to a planarization method utilized in manufacturing integrated circuit devices.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. For example, during manufacturing, semiconductor device density varies across an IC device. This can cause issues during planarization processes, such as lateral etching issues in less dense areas of the IC device, and remaining material layers over semiconductor devices in more dense areas of the IC device. Although existing planarization methods have been generally adequate for their intended purposes, they have not been entirely satisfactory in all respects.

SUMMARY

The present disclosure provides for many different embodiments. According to one of the broader forms of an embodiment of the present invention, a method includes: providing a substrate; forming a semiconductor feature over the substrate; forming a first photoresist layer over the substrate; performing a lithography process on the first photoresist layer, such the first photoresist layer includes an opening therein that exposes the semiconductor feature; performing a stabilization process on the first photoresist layer; forming a second photoresist layer over the first photoresist layer, wherein the second photoresist layer fills the opening; and etching back the first and second photoresist layers until the semiconductor feature is exposed.

In another one of the broader forms of an embodiment of the present invention, an apparatus includes: providing a substrate having a first region and a second region; forming a first semiconductor feature in the first region of the substrate and a second feature in the second region of the substrate, wherein the first semiconductor feature has a first pattern density and the second semiconductor feature has a second pattern density, the first pattern density being greater than the second pattern density; forming a first photoresist layer over the substrate; and patterning the first photoresist layer, thereby forming a patterned first photoresist layer over the substrate, wherein the patterned first photoresist layer includes an opening that exposes the first and second semiconductor features. The method further includes forming a second photoresist layer over the substrate, wherein the second photoresist layer fills in the opening; and planarizing the second photoresist layer such that the first and second semiconductor features are exposed. A freezing process on the patterned first photoresist layer, rendering the patterned first photoresist layer insoluble to the second photoresist layer.

Yet another one of the broader forms of an embodiment of the present invention involves a method. The method includes: providing a semiconductor substrate having semiconductor features disposed thereover; forming a first photoresist layer having a first solvent over the semiconductor substrate; performing a lithography process on the first photoresist layer, such the first photoresist layer includes openings therein that expose the semiconductor features; forming a second photoresist layer having a second solvent over the first photoresist layer, wherein the second photoresist layer fills the openings; and planarizing the second photoresist layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
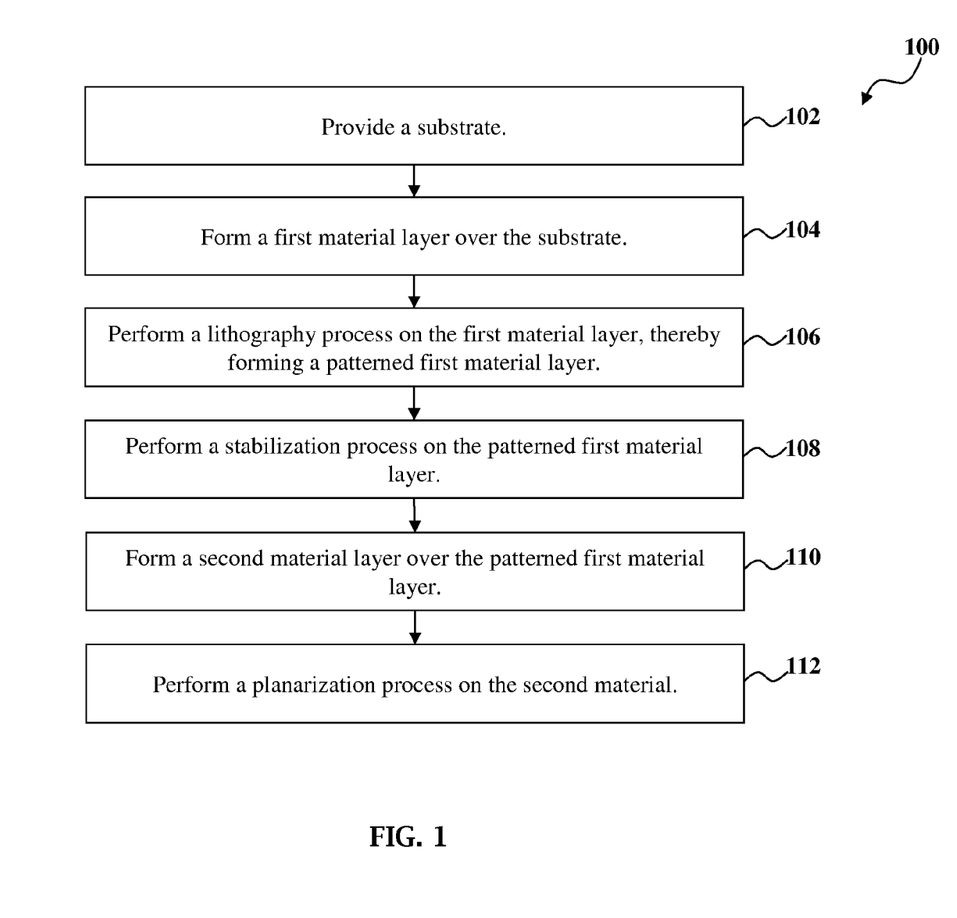
FIG. 1 is a flow chart of a method for fabricating an integrated circuit device according aspects of the present disclosure.

With reference to FIG. 1 and FIGS. 2-7, a method 100 and an integrated circuit device 200 are collectively described below. FIG. 1 is a flow chart of an embodiment of the method 100 for fabricating the integrated circuit device 200; and FIGS. 2-7 are diagrammatic sectional side views of the integrated circuit device 200, in portion or entirety, at various stages of fabrication according to the method 100 of FIG. 1. FIGS. 1-7 have been simplified for the sake of clarity to better understand the inventive concepts of the present disclosure. Additional steps can be provided before, during, and after the method 100, and some of the steps described below can be replaced or eliminated, for additional embodiments of the method. Additional features can be added in the integrated circuit device 200, and some of the features described below can be replaced or eliminated for additional embodiments of the integrated circuit device 200.

Figure 2:
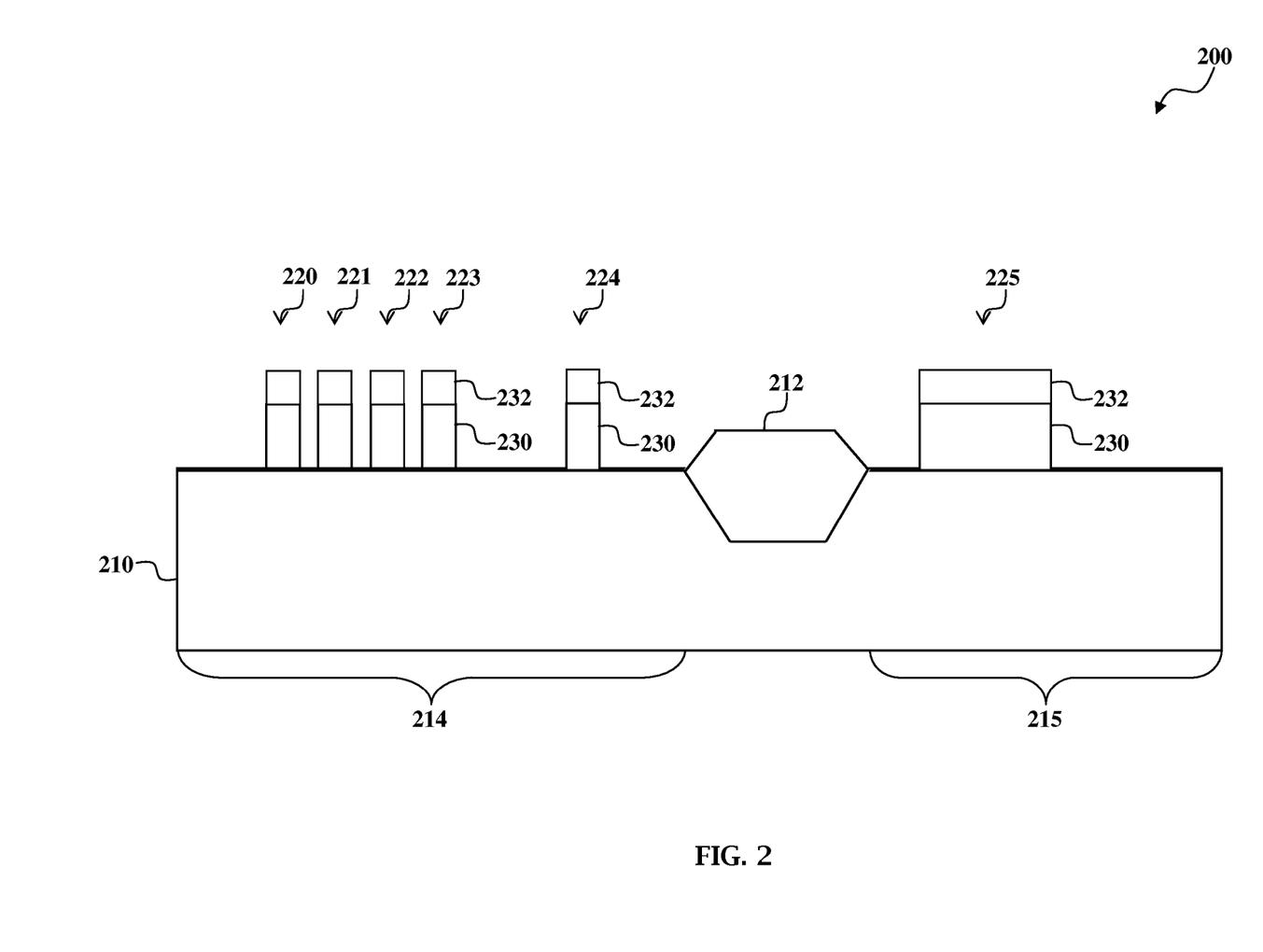
FIGS. 2-7 are various diagrammatic sectional side views of an embodiment of an integrated circuit device during various fabrication stages according to the method of FIG. 1.

Referring to FIGS. 1 and 2, at block 102, a substrate 210 is provided. The substrate 210 is a semiconductor substrate comprising silicon. Alternatively, the substrate 210 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, semiconductor substrate 210 may include a doped epi layer, a gradient semiconductor layer, and/or a semiconductor layer overlying another semiconductor layer of a different type, such as a silicon layer on a silicon germanium layer.

Isolation feature 212 is formed in the substrate 210 to isolate various regions, such as a first region 214 and a second region 215, of the substrate 210. The isolation feature 212 utilizes isolation technology, such as local oxidation of silicon (LOCOS) or shallow trench isolation (STI), to define and electrically isolate the various regions. The isolation feature 212 comprises silicon oxide, silicon nitride, silicon oxynitride, other suitable materials, or combinations thereof. The isolation feature 212 is formed by any suitable process. As one example, forming an STI includes a photolithography process, etching a trench in the substrate (for example, by using a dry etching and/or wet etching), and filling the trench (for example, by using a chemical vapor deposition process) with one or more dielectric materials. For example, the filled trench may have a multi-layer structure such as a thermal oxide liner layer filled with silicon nitride or silicon oxide. In another example, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

A semiconductor feature is formed in the first region 214, and a semiconductor feature is formed in the second region 215. The semiconductor feature can include various devices formed in the substrate 210. For example, the first region 214 includes a semiconductor feature including various devices 220, 221, 222, 223, and 224; and the second region 215 includes a semiconductor feature including device 225. The various devices 220-224 can be isolated from one another by isolation features (not shown), such as isolation feature 212. As illustrated in FIG. 2, the density of the semiconductor feature in the first region 214 is greater than the density of the semiconductor feature in the second region 215. Due to the difference in semiconductor feature density, it has been observed that conventional processing experiences difficulties in global planarization, such as lateral etching issues in the less densely populated regions of the integrated circuit devices, and limited processing windows, such as limited photolithography patterning and etching windows. The lateral etching issues can lead to undesirable isolation region and/or active region damage. As will be described further below, the disclosed method 100 can prevent such issues and enlarge processing windows.

The various devices 220-225 include but are not limited to passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. The various devices 220-225 can combine to form various memory cells and/or logic circuits in the integrated circuit 200.

In the depicted embodiment, the various devices 220-225 are represented by a gate structure, such as a gate stack including a gate layer 230 and a hard mask layer 232. The gate stacks are formed by deposition, lithography, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The lithography processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods, such as maskless photolithography, electron-beam writing, ion-beam writing, or combination thereof. The etching processes include dry etching, wet etching, and/or other etching methods.

The gate layer 230 is a polycrystalline silicon (polysilicon) layer. The polysilicon layer may be doped for proper conductivity. Alternatively, the polysilicon is not necessarily doped, and the polysilicon layer acts as a dummy gate to be formed and replaced in a subsequent gate replacement process. The gate layer 230 may include an interfacial layer, a high-k dielectric layer, a capping layer, a diffusion/barrier layer, a dielectric layer, a conductive layer, other suitable layers, or combinations thereof. A high-k dielectric layer can include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium dioxide-alumina ($HfO_2$—$Al_2O_3$) alloy, other suitable high-k dielectric materials, and/or combinations thereof. In an example, the gate layer 230 comprises a layer of silicon dioxide and a layer of high-k dielectric material. The gate layer 230 may comprise a conductive layer having a proper work function, which is therefore referred to as a work function layer. The work function layer comprises any suitable material, such that the layer can be tuned to have a proper work function for enhanced performance of the associated device. For example, if a P-type work function metal (P-metal) for a PMOS device is desired, TiN or TaN may be used. On the other hand, if an N-type work function metal (N-metal) for NMOS devices is desired, Ta, TiAl, TiAlN, or TaCN, may be used. The work function layer may include doped conducting oxide materials. The gate layer 230 may comprise other conductive materials, such as aluminum, copper, tungsten, metal alloys, metal silicide, other suitable materials, or combinations thereof. In an example, a conductive material layer is formed on the work function layer.

In the depicted embodiment, the hard mask layer 232 comprises an oxide material, such as silicon oxide. Alternatively, the hard mask layer 232 comprises a nitrogen-containing material, such as silicon nitride, silicon oxynitride, other suitable nitrogen-containing materials, or combinations thereof. In yet another alternative, the hard mask layer 232 includes an amorphous carbon material, silicon carbide, tetraethylorthosilicate (TEOS), other suitable materials, or combinations thereof. The hard mask layer 232 could include a multi-layer structure including any of the above materials.

Figure 3:
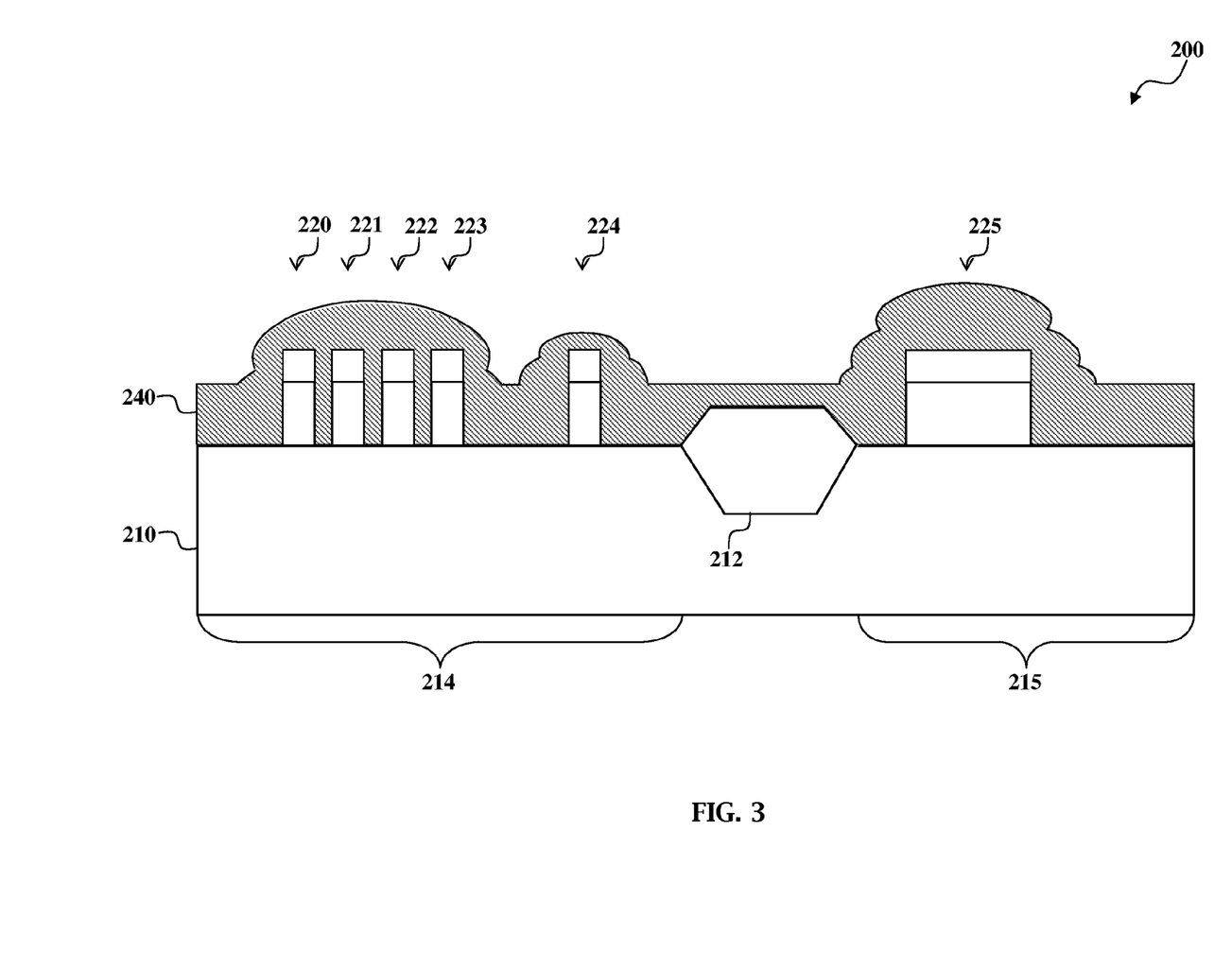

Referring to FIGS. 1 and 3, at block 104, a first material layer 240 is formed over the substrate 210, including over the various devices 220-225. The first material layer 240 is a photoresist layer. The photoresist layer includes a polymer, photoacid generator, and a solvent. The photoresist layer may further include additives, such as base quenchers, surfactants, dyes, crosslinkers, other suitable additives, or combinations thereof. The photoresist layer is a positive-type or negative-type resist material. One exemplary resist material is a chemical amplifying (CA) resist. The first material layer 240 may have a multi-layer structure. For example, the first material layer 240 may further include an anti-reflective coating (ARC) layer, such as a top ARC layer, a bottom ARC layer, or both a top and bottom ARC layer. The first material layer 240 is formed by a process as known in the art, for example, by a spin-on coating process.

Figure 4:
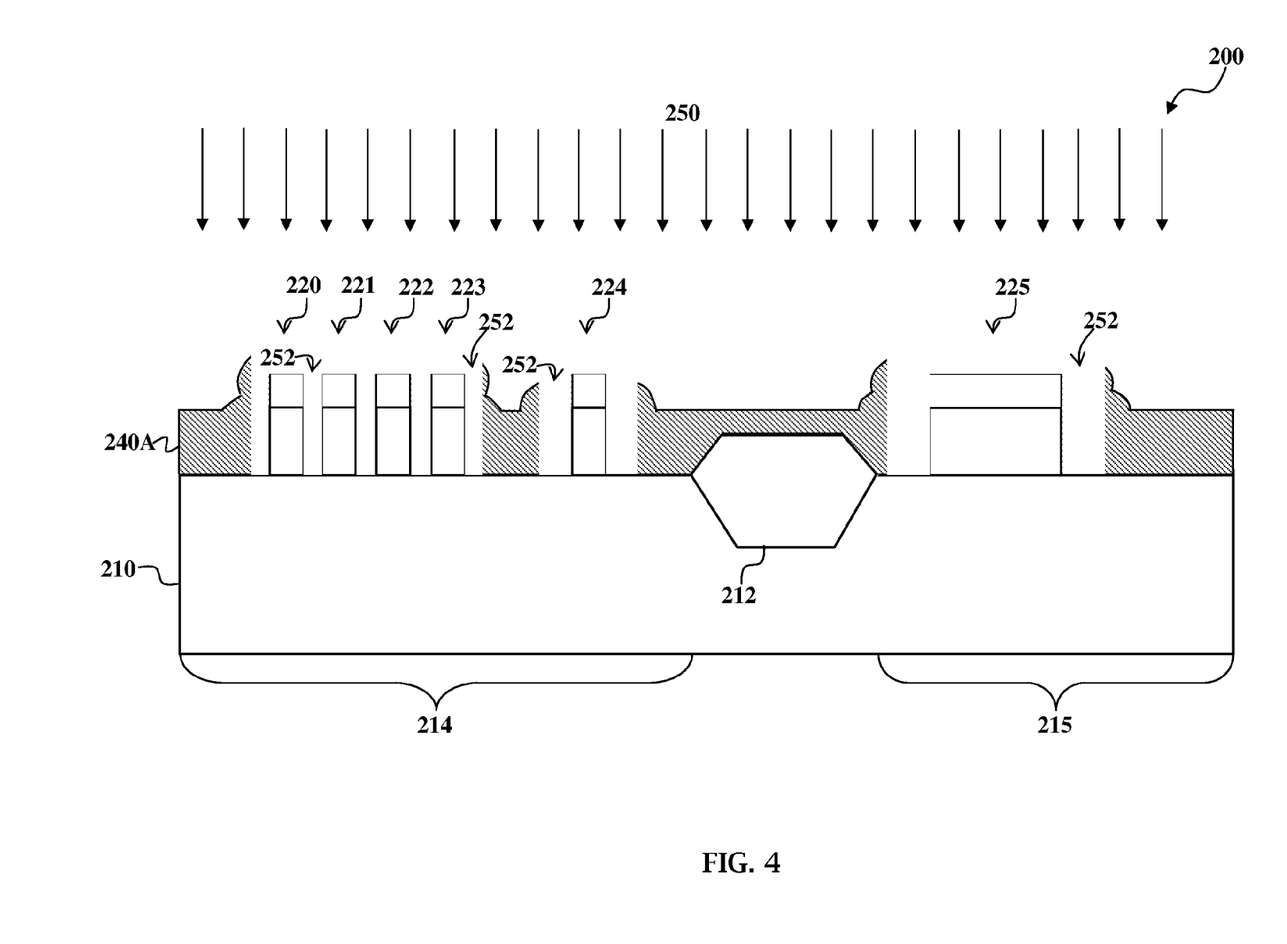

Referring to FIGS. 1 and 4, at block 106, a lithography process 250 is performed on the first material layer 240, thereby forming a patterned first material layer 240A. The terms lithography, immersion lithography, photolithography, and optical lithography may be used interchangeably in the present disclosure. The lithography process 250 includes an exposure process, where the first material layer 240 is exposed to radiation to transfer a pattern (e.g., a geometric pattern) from a photomask to the first material layer 240 (i.e., a light-sensitive layer, such as a photoresist layer) on the substrate 210. More than one photomask, also referred to as a mask or reticle, may be utilized for the lithography process 250. The radiation causes a chemical change in exposed regions of the first material layer 240, which may increase or decrease solubility of the exposed regions. If the exposed regions become more soluble, the first material layer 240 is referred to as a positive photoresist. If the exposed regions become less soluble, the first material layer 240 is referred to as a negative photoresist.

The radiation beam used to expose the first material layer 240 may be ultraviolet and/or extended to include other radiation beams, such as ion beam, x-ray, extreme ultraviolet, deep ultraviolet, and other proper radiation energy. The lithography process 250 may implement krypton fluoride (KrF) excimer lasers, argon fluoride (ArF) excimer lasers, ArF immersion lithography, ultraviolet (UV) radiation, extreme ultraviolet (EUV) radiation, and/or electron-beam writing (e-beam). The exposing process may also be implemented or replaced by other proper methods, such as maskless photolithography, ion-beam writing, and/or molecular imprint techniques. It is understood that a single exposure patterning process, double exposure patterning process, or multiple exposure patterning process may be performed.

The lithography process 250 includes a developing process that selectively removes the exposed or unexposed regions to a developing solution to create the patterned first material layer 240A over the substrate. The remaining portions of the first material layer 240 define the patterned first material layer 240. In the depicted embodiment, the pattern contains one or more openings 252, wherein the various devices 220-225 are exposed. A developing solution may be utilized in the developing process to remove portions of the first material layer 240, such as tetramethylammonium hydroxide (TMAH). Any concentration level of TMAH developer solution may be utilized, such as approximately 2.38% TMAH developer solution. The developing solution may remove the exposed or unexposed portions depending on the resist type. The lithography process 250 may also include baking processes, such as a post-exposure bake (PEB) or pre-exposure bake, and/or rinsing processes, that are performed before and/or after exposing the first material layer 240.

Figure 5:
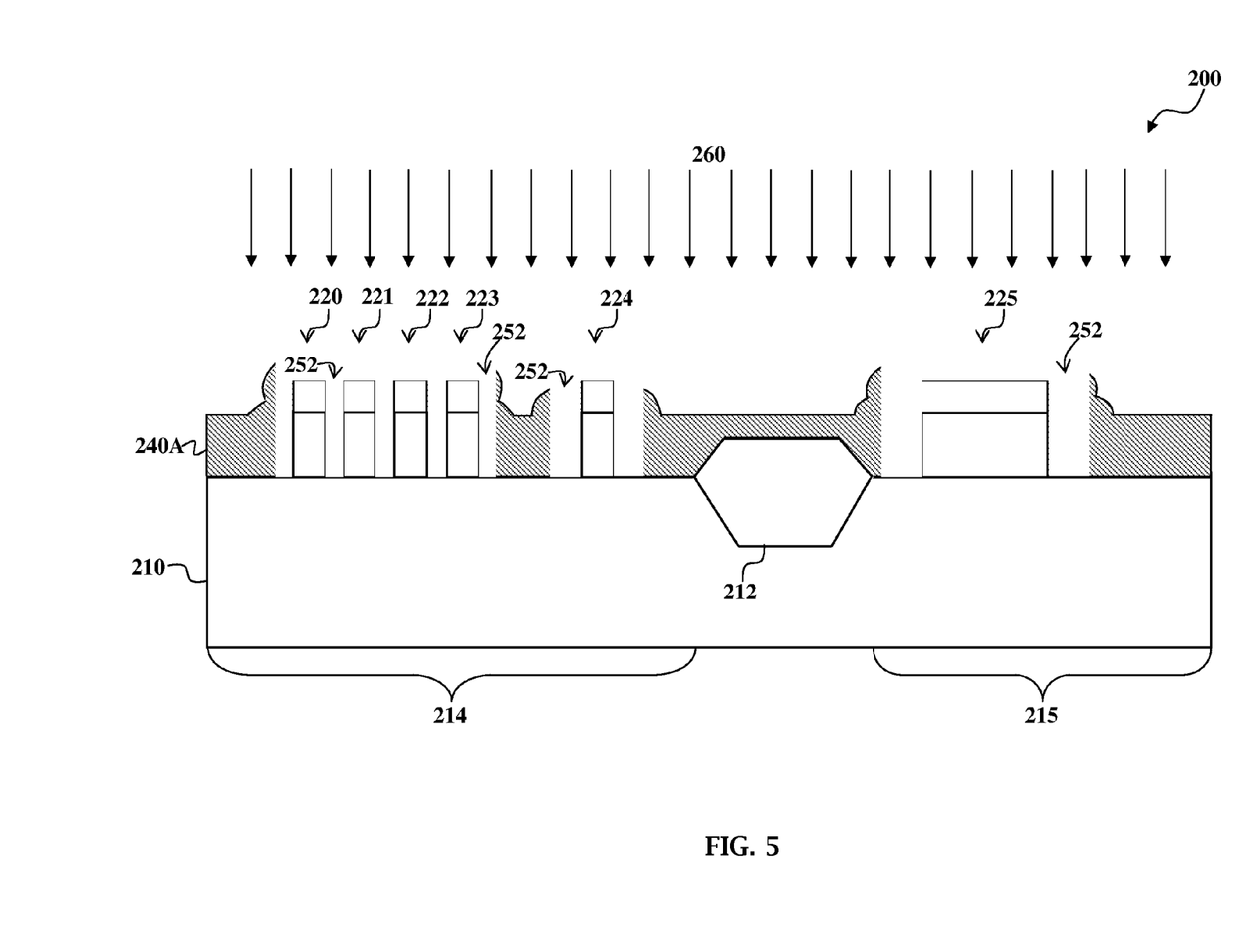
Figure 6:
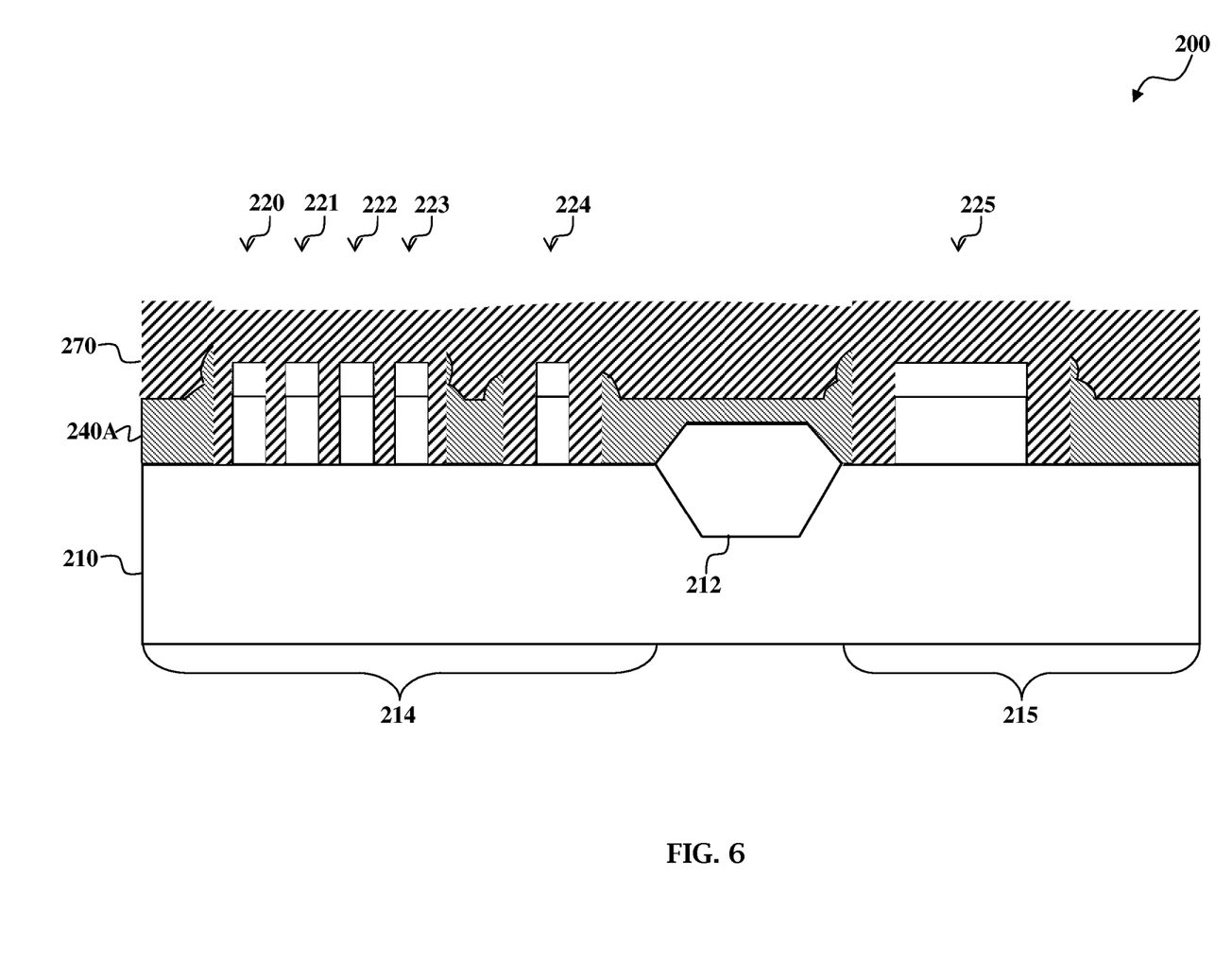

Referring to FIGS. 1 and 5-6, at block 108, a stabilization (or freeze) process 260 is performed on the patterned first material layer 240A, and at block 110, a second material layer 270 is formed over the patterned first material layer 240A. The stabilization process 260 is implemented to prevent the first material layer 240 (patterned first material layer 240A) from swelling or dissolving when the second material layer 270 is formed thereover, and/or from being effected by any additional exposure and development processes that may be used during patterning of the second material layer 270. The patterned first material layer 240A may be stabilized by activating crosslinkers within the patterned first material layer 240A, thereby hardening the patterned first material layer 240A, such that the patterned first material layer 240A becomes insoluble in a solvent of the second material layer 270.

In an example, the stabilization process 260 is a radiation curing, thermal curing, or combination thereof. The thermal or radiation curing processes initiate cross-linking reactions within the patterned first material layer 240A, thereby solidifying the patterned first material layer 240A. In a radiation curing example, cross-linking reactions in the patterned first material layer 240A are initiated by exposing the patterned first material layer 240A to an appropriate wavelength of light, such as ultraviolet (UV) radiation and/or deep ultraviolet (DUV) radiation wavelengths, for a period of time specific to the particular composition of the patterned first material layer 240A. In a thermal curing example, the patterned first material layer 240A is heated to a desired temperature or range of temperatures for a period of time. For example, the temperature range may be from about 150° C. to about 300° C. Alternatively, an e-beam curing process may be implemented.

In another example, the stabilization process 260 is an ion implantation process. A doping species for the ion implantation process includes argon, nitrogen, fluorine, gallium, indium, boron, phosphorus, arsenic, antimony, tin, carbon, silicon, other suitable doping species, or combination thereof. The doping species is selected to avoid changing electrical performance of the integrated circuit device 200, for example, by implanting the substrate 210 with an oppositely charged dopant.

In yet another example, the stabilization process 260 includes forming a coating over the patterned first material layer 240A, such that a chemical reaction occurs in the patterned first material layer 240A, thereby forming a coating (or barrier) layer on the surfaces of the patterned first material layer 240A that are exposed to the coating. For example, the coating may be formed by methods described in U.S. Patent Application Publication No. 2009/0258501 filed Jun. 30, 2008, entitled "Double Patterning Method," such that the patterned first material layer 240A will not be dissolved by the second material layer 270, the entire disclosure of which is incorporated herein by reference.

As illustrated in FIG. 6, the second material layer 270 fills the openings 252 in the patterned first material layer 240A. The second material layer 270 may include a same or different composition than the first material layer 240. In the depicted embodiment, the second material layer 270 is a photoresist layer. The photoresist layer includes a polymer, photoacid generator, and a solvent. The photoresist layer may further include additives, such as base quenchers, surfactants, dyes, crosslinkers, other suitable additives, or combinations thereof. The photoresist layer is a positive-type or negative-type resist material. One exemplary resist material is a chemical amplifying (CA) resist. The second material layer 270 may comprise a spin-on-glass (SOG) material. The second material layer 270 may have a multi-layer structure. For example, the second material layer 270 may further include an anti-reflective coating (ARC) layer, such as a top ARC layer, a bottom ARC layer, or both a top and bottom ARC layer. Alternatively, the second material layer 270 is an ARC layer. The second material layer 270 is formed by a process as known in the art, for example, by a spin-on coating process.

Alternatively, the stabilization process 260 could be omitted. In such a situation, the first material layer 240 comprises a different material layer than the second material layer 270. For example, the first material layer 240 comprises a material having a different solvent type than the second material layer 270. The solvent may be an inorganic solvent, organic solvent, or other suitable solvent. In an example, the first material layer 240 could include an organic solvents, such as propylene glycol monomethyl ether (PGME), propylene glycol monomethyl ether acetate (PGMEA), or combination thereof, while the second material layer 270 comprises a water-based solvent.

Figure 7:
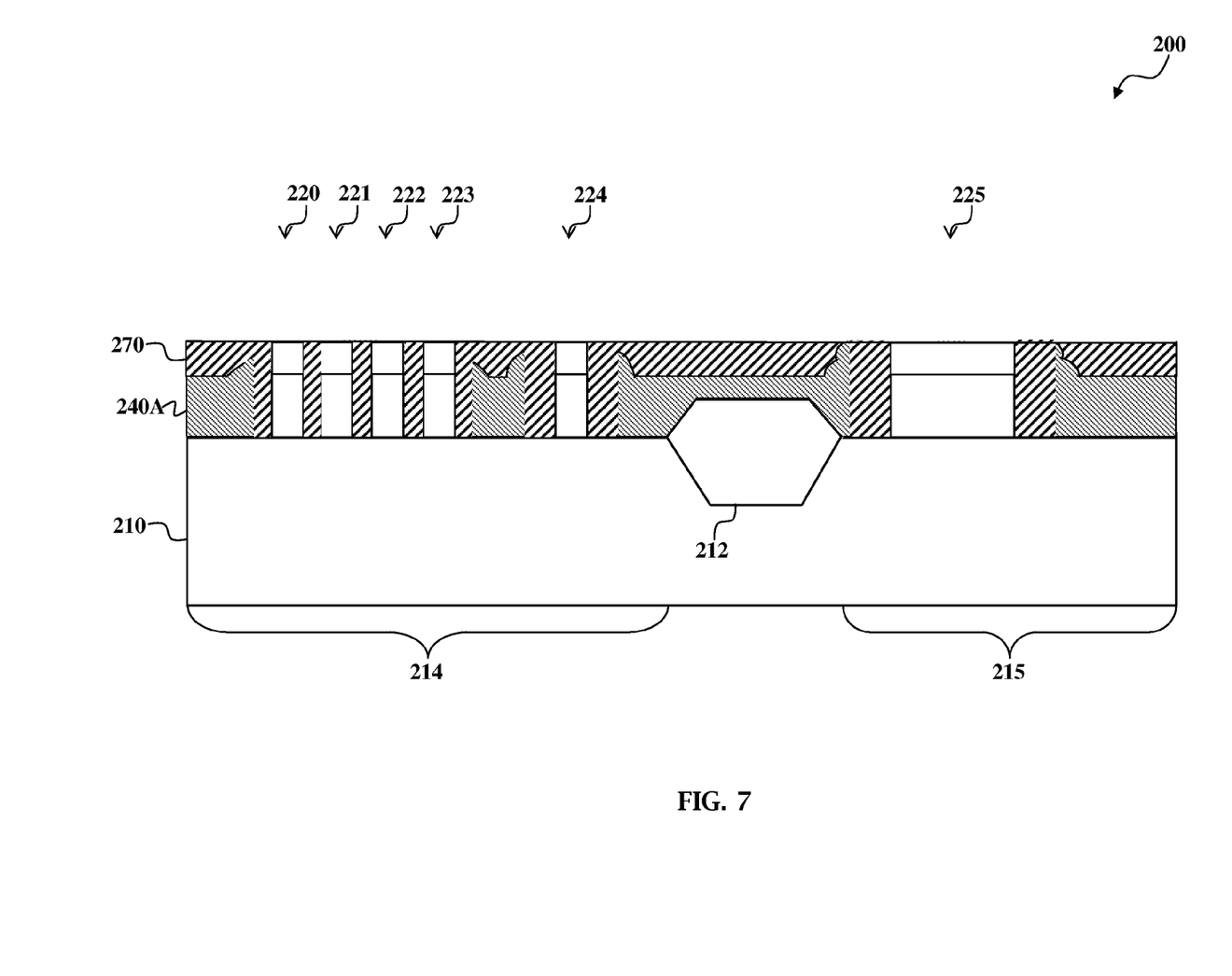

Referring to FIGS. 1 and 7, at block 112, the second material layer 270 is planarized. In the depicted embodiment, the second material layer 270 is planarized. The planarization process can also remove portions of the patterned first material layer 240A, such that both the second material layer 270 and the first material layer 240 are planarized. In the depicted embodiment, the planarization process is performed until the various devices 220-225 are exposed, for example, until a top surface of the gate structures, particularly hard mask layer 232, is exposed. Planarizing the second material layer 270 includes an etch back process, such as a photoresist etch back process that is carried out to remove the second material layer 270 until an endpoint detection, such as the hard mask layers 232, is reached.

The integrated circuit device 200 may undergo further CMOS or MOS technology processing to form various features known in the art. For example, in an embodiment, the gate layer 230 remains polysilicon in the final device. In another embodiment, a gate replacement process (or gate last process) is performed, wherein the hard mask layer 232 is removed and the polysilicon gate layer 230 is replaced with a metal gate. Further, contact features, such as silicide regions, may also be formed. The contact features may be coupled to the source and drain regions of the substrate 210. The contact features comprise silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-level dielectric (ILD) layer can further be formed on the substrate 210 and a chemical mechanical polishing (CMP) process is further applied to planarize the substrate.

Subsequent processing may further form various contacts/vias/lines and multilayer interconnect features (e.g., metal layers and interlayer dielectrics) on the substrate 210, configured to connect the various features or structures of the semiconductor device 200. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The disclosed reverse planarization process can be utilized to planarize any layer of the integrated circuit device 200 during fabrication. It has been observed that the reverse planarization process can increase processing windows, such as photolithography patterning and etching process windows. Further, the reverse planarization process reduces (and sometimes eliminates) lateral etching issues arising in conventional planarization processes. For example, conventional planarization processes can leave the material layers over some device areas, or leave the active and/or isolation feature regions exposed. The disclosed reverse planarization process can provide planarization without damaging active and/or isolation feature regions. Further, the disclosed reverse planarization process can provide adequate planarization regardless the density of a region. For example, in the depicted embodiment, adequate planarization is achieved in both regions 214 and 215 of the integrated circuit device 200, though region 215 is less dense than region 214. It is understood that different embodiments may have different advantages, and that no particular advantage is necessarily required of any one embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    providing a substrate;
    forming a semiconductor feature over the substrate;
    forming a first photoresist layer over the substrate;
    performing a lithography process on the first photoresist layer, such the first photoresist layer includes an opening therein that exposes the semiconductor feature;
    performing a stabilization process on the first photoresist layer;
    forming a second photoresist layer over the first photoresist layer, wherein the second photoresist layer fills the opening; and
    etching back the first and second photoresist layers until the semiconductor feature is exposed.

2. The method of claim 1 wherein the performing the stabilization process comprises eliminating mixing between the first and second photoresist layers.

3. The method of claim 1 wherein the performing the stabilization process comprises performing a thermal curing, a radiation curing, or combination thereof.

4. The method of claim 3 wherein the performing the radiation curing comprises performing a ultraviolet (UV) radiation curing.

5. The method of claim 1 wherein the performing the stabilization process comprises performing an ion implantation process.

6. The method of claim 5 wherein the performing the ion implantation process comprises selecting a dopant from the group consisting of argon, nitrogen, fluorine, gallium, indium, boron, phosphorus, arsenic, antimony, tin, carbon, silicon, or combination thereof.

7. The method of claim 1 wherein the forming the semiconductor feature comprises forming a plurality of gate stacks over the substrate.

8. The method of claim 7 wherein the forming the plurality of gate stacks over the substrate comprises providing a first density of the gate stacks in a first region of the substrate and providing a second density of the gate stacks in a second region of the substrate, wherein the first density is greater than the second density.

9. A method comprising:
providing a substrate having a first region and a second region;
forming a first semiconductor feature in the first region of the substrate and a second semiconductor feature in the second region of the substrate, wherein the first semiconductor feature has a first pattern density and the second semiconductor feature has a second pattern density, the first pattern density being greater than the second pattern density;
forming a first photoresist layer over the substrate;
patterning the first photoresist layer, thereby forming a patterned first photoresist layer over the substrate, wherein the patterned first photoresist layer includes an opening that exposes the first and second semiconductor features;
performing a freezing process on the patterned first photoresist layer;
forming a second photoresist layer over the substrate, wherein the second photoresist layer fills in the opening;
planarizing the second photoresist layer such that the first and second semiconductor features are exposed; and
wherein the freezing process renders the patterned first photoresist layer insoluble to the second photoresist layer.

10. The method of claim 9 wherein the performing the freezing process comprises subjecting the patterned first photoresist layer to a thermal curing, a radiation curing, or combination thereof.

11. The method of claim 9 wherein the performing the freezing process comprises subjecting the patterned first photoresist layer to an ion implantation process.

12. The method of claim 11 wherein the subjecting the patterned first photoresist layer to the ion implantation process comprises selecting a dopant type that is opposite a dopant type of the substrate.

13. The method of claim 11 wherein the subjecting the patterned first photoresist layer to the ion implantation process comprises selecting the dopant from the group consisting of argon, nitrogen, fluorine, gallium, indium, boron, phosphorus, arsenic, antimony, tin, carbon, silicon, or combination thereof.

14. The method of claim 9 wherein the performing the freezing process comprises forming a coating on the patterned first photoresist layer, such that chemical reaction is induced in surfaces of the patterned first photoresist layer that are exposed to the coating.

15. The method of claim 9 wherein the forming the first photoresist layer and the forming the second photoresist layer comprises forming the first photoresist layer with a composition having a first solvent and forming the second photoresist layer with a composition having a second solvent different than the first solvent.

16. A method comprising:
providing a semiconductor substrate having semiconductor features disposed thereover;
forming a first photoresist layer having a first solvent over the semiconductor substrate;
performing a lithography process on the first photoresist layer, such the first photoresist layer includes openings therein that expose the semiconductor features;
forming a second photoresist layer having a second solvent over the first photoresist layer, wherein the second photoresist layer fills the openings; and
planarizing the second photoresist layer.

17. The method of claim 16 further comprising stabilizing the first photoresist layer.

18. The method of claim 17 wherein the stabilizing the first photoresist layer comprises, after performing the lithography process, subjecting the first photoresist layer to a curing process or an ion implantation process.

19. The method of claim 16 wherein the planarizing the second photoresist layer comprises performing a photoresist etch back process.

20. The method of claim 16 wherein the planarizing the second photoresist layer further comprises planarizing the first photoresist layer.

* * * * *